United States Patent [19]

Knecht

[11] Patent Number: 5,577,319
[45] Date of Patent: Nov. 26, 1996

[54] METHOD OF ENCAPSULATING A CRYSTAL OSCILLATOR

[75] Inventor: Thomas A. Knecht, Algonquin, Ill.

[73] Assignee: Motorola, Inc., Schaumburg, Ill.

[21] Appl. No.: 414,249

[22] Filed: Mar. 31, 1995

[51] Int. Cl.⁶ .......................... H01R 43/00; H01L 23/24
[52] U.S. Cl. .................. 29/827; 29/855; 29/530; 257/687; 264/272.17; 264/255
[58] Field of Search ............... 29/827, 855, 530; 250/687, 790; 264/272.17, 255; 331/68; 361/813

[56] References Cited

U.S. PATENT DOCUMENTS 5,041,395  8/1991  Steffen .................................. 257/687
5,173,766  12/1992 Long et al. .
5,332,864  7/1994  Liang et al. ........................... 361/813

Primary Examiner—P. W. Echols
Attorney, Agent, or Firm—Gary J. Cunningham; Brian M. Mancini

[57] ABSTRACT

A method of encapsulating a crystal oscillator (100). First, a dielectric material is assembled or connected to the bottom side of a lead frame (102). Second, oscillator components including a piezoelectric element, capacitors and an integrated circuit are attached on the lead frame (104). Third, an epoxy dam is dispensed around the periphery of the oscillator component locations (106). Fourth, a encapsulant is dispensed within the epoxy dam to encapsulate the oscillator components (108). Fifth, the epoxy dam and encapsulant are cured (110). Thereafter, the oscillator is singulated from the lead frame and the leads are formed for mounting (112).

12 Claims, 3 Drawing Sheets

METHOD OF ENCAPSULATING A CRYSTAL OSCILLATOR

FIELD OF THE INVENTION

The present invention relates generally to frequency control devices and, in particular, to a method of encapsulating a crystal oscillator.

BACKGROUND OF THE INVENTION

Frequency control devices are known to include various types of crystal oscillators. A typical quartz crystal oscillator utilizes several components including a piezoelectric element, an integrated circuit, capacitors, inductors, resistors, etc. These frequency control devices are commonly found in electronic communication devices such as, cellular phones, pagers, radios and wireless data devices. As consumer demand continually drives down the size and cost of this equipment, the need for oscillators to be smaller and lower in cost has become even greater.

The most sensitive component in a crystal oscillator is the piezoelectric element. Typically, this element is independently sealed in a hermetic package. The purpose of encapsulation is to passivate the integrated circuit (IC) die from the effects of the environment. This die is fragile and must be protected from excessive thermal and mechanical stresses and strains. Also, the die must be protected from exposure to external chemicals including moisture, oxygen, acids, corrosives, etc. Previously, this passivation process had been accomplished by plastic encapsulation techniques, ceramic packaging, or potting epoxies on printed circuit boards.

The most common method for passivation of an IC is plastic encapsulation by transfer molding. In this technique an IC is mounted and wire bonded to a conductive lead frame. Then the lead frame is suspended in a two piece mold cavity and plastic is injected under high temperature and pressure to encapsulate the part. This is commonly referred to as transfer molding. This process is low cost, but it does have problems. Due to the temperatures and pressures used in this process, occasional damage occurs to the IC or its wirebonds. Also, some plastics can outgas chlorine and ammonia by-products which can corrode the metalization on the IC. In addition, plastics tend to be hydrophilic and may lose their effectiveness against moisture infiltration.

On the other hand, potting epoxies have been used in some applications to directly encapsulate IC dies on various substrates. Potting techniques sometimes incorporate complicated structures and have microcracking problems due to the differences in thermal expansion coefficients of the materials used. However, this technique is of a lower cost than ceramic packaging.

Similar prior art potting techniques have utilized a metal dam to contain a potting compound over a lead frame. There are several problems with this approach. First, an additional B-stage epoxy process is needed to provide a moisture barrier between the leads and the metal dam. Second, extra care must be taken when placing the metal dam since too much application pressure will cause the dam to short the leads. Third, in normal practice the metal dam is located about 3 mils away from the leads. This may easily cause parasitic capacitance and signaling problems. Fourth, the use of a preformed or machined metal dam increases the cost of the product. The present invention can solve many of these problems by the use of an epoxy dispensed, non-conductive dam.

In ceramic packaging techniques, the IC die is first mounted to a ceramic substrate and this ceramic substrate is placed within a hermetic package. This hermetic package may take the form of a welded metal can with glass-filled feedthroughs for the external electrical connections, or it may take the form of a single or multi-layered ceramic substrate that is sealed to a single or multi-layered ceramic lid by means of an epoxy or glass frit. Alternatively, the ceramic substrate may be sealed with a brazed or welded steel alloy 'lid'. Although the above technique has been successful, these packages are structurally complex and relatively expensive.

A significant portion of the cost of a quartz crystal oscillator is in its packaging. Also, these oscillators typically have a higher material and labor cost than an IC chip. Therefore, scrap costs due to yield losses are to be avoided if at all possible. Previously, the packaging used for oscillator devices was mostly ceramic packaging. This packaging has demonstrated good yields and therefore low incurred scrap costs. However, the ceramic structures themselves, though relatively effective, are complicated and have a higher inherent cost. Cost reduction can be achieved if the packaging for these oscillators can be simplified without sacrificing yield.

There is a need for an improved encapsulation process for making crystal oscillators that is: (i) low cost and high yield; (ii) minimizes the number of process steps and separate packaging components; (iii) does not require external machining of sealing components; (iv) is robust under environmental testing; (v) minimizes problems from differing thermal expansion coefficients of package materials; (vi) reduces the migration of moisture or oxygen into the package; and (vii) is readily manufacturable without custom equipment or added costs.

DETAILED DESCRIPTION OF THE PREFERRED EMBODIMENT

Figure 1:
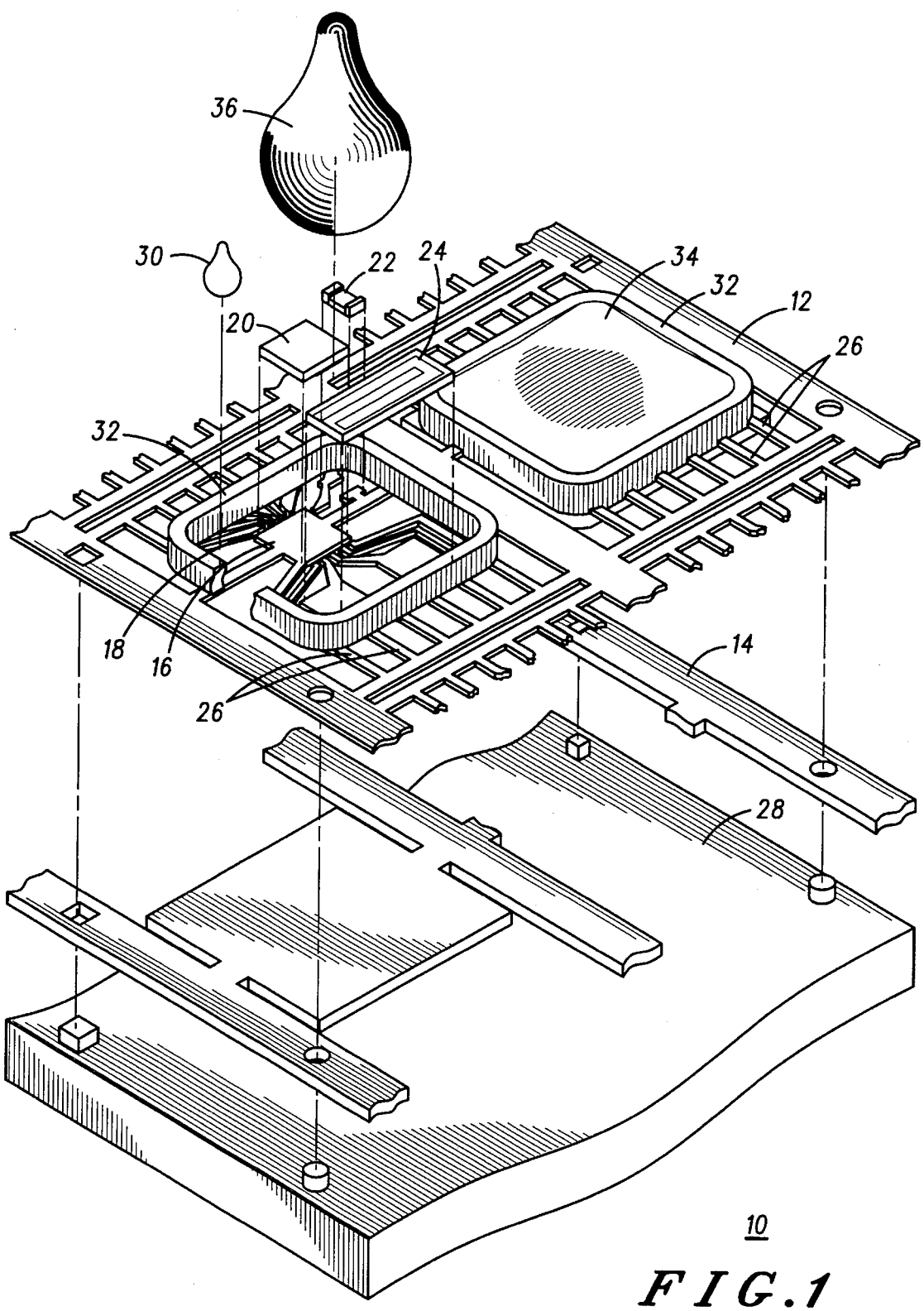
FIG. 1 shows a perspective view of a partially and fully processed crystal oscillator, in accordance with the present invention.

The present invention provides an improved method for the encapsulation of a crystal oscillator 10 and similar frequency control devices that utilize an integrated circuit die. In FIG. 1, a partially and fully processed crystal oscillator 10 is shown.

As shown in FIG. 1, the crystal oscillator 10 includes a lead frame 12, an integrated circuit (IC) 20, a capacitor 22, a piezoelectric element 24, an epoxy dam 32, and an encapsulant 34. More particularly, the oscillator may include a dielectric layer 14.

The lead frame 12 can be punched or etched from a metal sheet. In a preferred embodiment, the lead frame 12 is punched from a copper alloy sheet in an array form, substantially as shown in FIG. 1, for example. The advantage of an array arrangement is that automation and parallel processing may be used to increase factory production throughput.

The lead frame 12 is punched or etched so as to provide a plurality of leads 26 connected to and extending from the lead frame 12 into the package and terminating with a wirebond pad 18. The wirebond pads 18 are adjacent to an IC die bond pad 16 which facilitates wire bonding of the IC 20 to the leads 26. The IC 20, capacitor 22 and piezoelectric element 24 are electrically connected to the lead frame 12 as well.

The epoxy dam 32 can be made from a material that is viscously dispensed (shown as item 30 in FIG. 1) to the lead frame 12 so as to surround and substantially seal each lead 26. In a preferred embodiment, the epoxy dam 32 is a non-conductive material, such as a high viscosity epoxy such as Dexter Hysol FP4451™ (manufactured by the Hysol Division of Dexter Corp. of Industry, California). However, a variety of phenol-formaldehyde based epoxies known in the art may be used as well. The material of the epoxy dam 32 should be of a thixotropic property which substantially minimally spreads (sticks to where it is applied) after dispensing. The encapsulant 34 comprises a material that can be viscously dispensed in uncured form (shown as item 36 in FIG. 1) to the lead frame 12 and within the epoxy dam 32 so as to cover the oscillator components 20, 22, 24 and substantially surround and seal each individual lead 26. The encapsulant 34 preferably has a lower viscosity than the epoxy dam 32, so as to substantially uniformly spread and be received in dam 32.

In a preferred embodiment, the encapsulant 34 is a non-conductive and low viscosity potting material, such as an epoxy, such as Dexter Hysol FP4450™ (manufactured by the Hysol Division of Dexter Corp. of Industry, California). However, a variety of equivalent or similar phenol-formaldehyde based epoxies known in the art may be used in this application. The encapsulant 34 should have certain thixotropic properties which allow the material to freely flow to fill the cavity defined by the epoxy dam 32 and layer 14, while being substantially free from forming air bubbles. The formation of air bubbles could cause microcracks during solder reflow, which will lead to premature environmental failure and leakage.

One embodiment can include a dielectric layer 14 sealing the bottom of the crystal oscillator 10. This dielectric layer 14 may be made of an electrically insulative material, such as a polyimide plastic or the like. In a preferred embodiment, the layer 14 can include a material known as Kapton™ (manufactured by DuPont), which is readily available with a pre-applied moisture-resistant B-stage epoxy. Other materials may be used. For example, polyimide plastics have differing properties relating to mechanical and dielectric strength, moisture and chemical absorption and conduction. Different polyimide plastics can be found that excel in various desired properties. However, the properties of Kapton™ are well known in the art and can be used more predictably in this application, and therefore are considered preferred. The dielectric layer 14 is etched to fit the base of the crystal oscillator 10.

Figure 5:
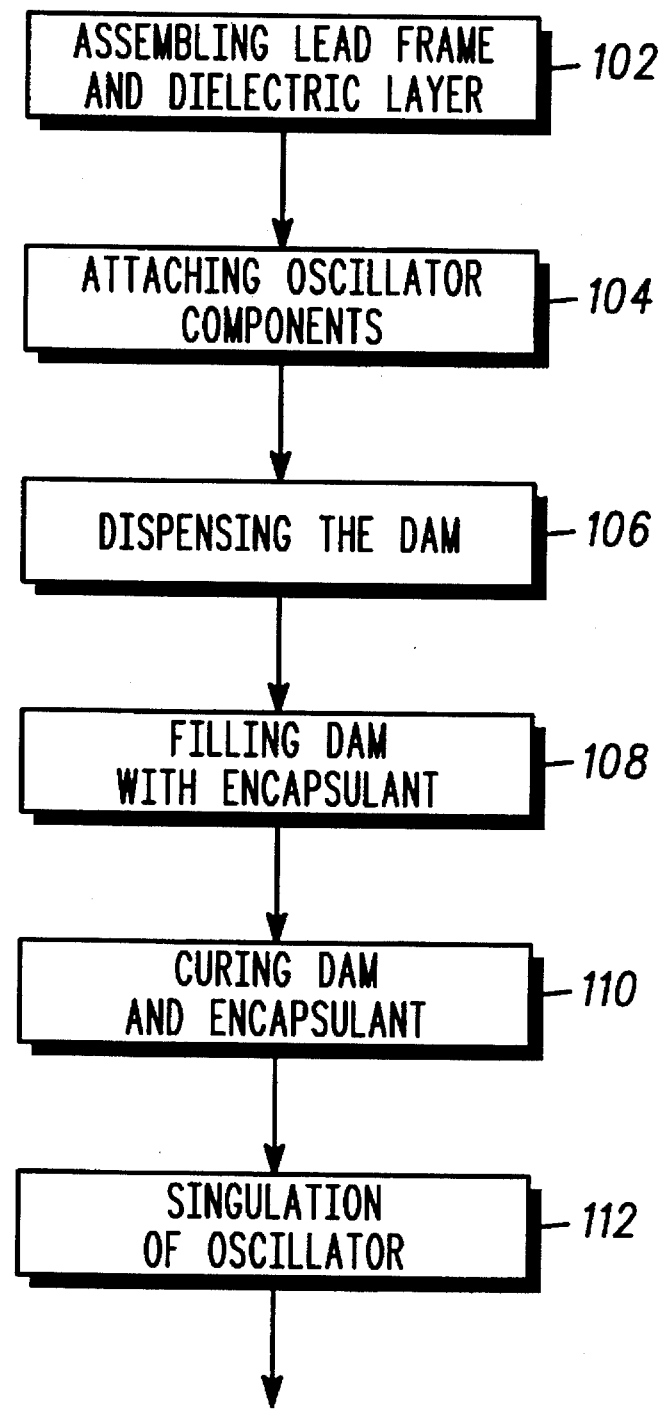
FIG. 5 shows a block diagram for a method of encapsulating a crystal oscillator, in accordance with the present invention.

Referring to FIGS. 1 and 5, a first major step can include an assembling step 102 of assembling, securing or contacting a lead frame 12 with a dielectric layer 14. The lead frame 12 and dielectric layer 14 can be temporarily secured by a transporter (support) 28 for subsequent processing. In a preferred embodiment, the lead frame 12 has been suitably configured, such as by being previously punched from a copper alloy sheet in an array form. The advantage of an array configuration or arrangement, is that automation and parallel processing may be used to increase factory production throughput.

Also in a preferred embodiment, the lead frame 12 can be selectively plated, before or after processing, to minimize corrosion, improve wirebonding inside the package and improve solderability outside the package. The lead frame 12 may be plated with a precious metal, preferably such as silver, on the wire bond pads 18, in proximity to and around where the IC 20 is placed, to improve wirebonding. In addition, this embodiment includes the leads 26 being tin (lead-tin) plated after processing the crystal oscillator 10, to improve solderability.

The dielectric layer 14 may be of a polyimide plastic. In a preferred embodiment, the polyimide plastic dielectric layer is made from Kapton™ having an adhesive such as a B-stage epoxy applied to the top surface thereof (available from DuPont). The dielectric layer 14 is etched to fit the base of the crystal oscillator 10 and is adhesively attached to the base (bottom) of the crystal oscillator 10 by applying pressure between the dielectric layer 14 and the lead frame 12. The dielectric layer 14 serves to reduce the possibility of moisture or contaminant infiltration into the crystal oscillator 10. Also, during processing the dielectric layer 14 forms a bottom boundary to the flow of the encapsulant 34 and contributes to keeping the flow of the encapsulant 34 around the leads 26, to better seal the leads 26. In addition, the dielectric layer 14 ,provides additional electrical isolation for the crystal oscillator 10.

Alternatively, a continuous dielectric layer 14 may be screen printed onto the bottom of the lead frame 12 and suitably cured. This has the advantage of saving some process steps and costs while providing a bottom boundary for the encapsulant 34 flow and electrical isolation.

In a preferred embodiment, a transporter 28 can be used to temporarily secure the lead frame 12 and dielectric layer 14 for processing through the manufacturing line. A transporter 28, as used herein, is simply a means for transporting the lead frame during manufacturing. In a preferred embodiment, the transporter 28 is manufactured from Delrin™ or Teflon™ (available from E. I. DuPont). Similar dimensionally stable materials may be substituted for the transporter 28 as long as they can withstand processing without substantially stressing or distorting the lead frame 12. The material for the transporter 28 should be selected to prevent contamination of the transporter 28 by the materials used, as detailed herein, such as epoxies 32, 34 if they should come into contact with the transporter 28.

In another preferred embodiment, the first major process step (assembling step) 102 begins by assembling or placing the lead frame 12 directly onto the transporter 28. The transporter 28 as used herein forms a bottom boundary for the flow of the encapsulant 34 and contributes to keeping the flow of the encapsulant 34 around the leads 26 to better seal the leads 26. The transporter 28 also provides a means for transporting the lead frame during manufacturing. In a preferred embodiment, the transporter 28 is manufactured from Delrin™ or Teflon™ (available from E. I. DuPont), which has a low adhesion to epoxy. Stated another way, the epoxy will not tend to stick to it. As should be understood, other similar dimensionally stable materials may be used for the transporter 28, as long as epoxy does not adhere well to them, and they can withstand processing without substantially stressing or distorting the lead frame 12. The material for the transporter 28 should be selected to prevent contamination of the transporter 28 by the materials used herein, such as the epoxies 32, 34 if they should come into contact with the transporter 28.

In another preferred embodiment, the first major process step 102 begins by assembling (placing) the lead frame 12 directly to the dielectric layer 14 (without the use of a transporter 28). The dielectric layer 14 is etched to fit the base of the crystal oscillator 10 and it is adhesively attached to the base of the crystal oscillator 10 by applying pressure between the dielectric layer 14 and the lead frame 12. The dielectric layer 14 serves to reduce the possibility of moisture or contaminant infiltration into the crystal oscillator 10. Also, during processing the dielectric layer 14 forms a bottom boundary to the flow of the encapsulant 34 and contributes to keeping the flow of the encapsulant 34 around the leads 26 to better seal the leads 26. In addition, the dielectric layer 14 provides additional electrical isolation for the crystal oscillator 10.

Alternatively, a continuous dielectric layer 14 may be screen printed onto the bottom of the lead frame 12. This has the advantage of saving some process steps and costs while providing a bottom boundary for the encapsulant 34 flow and electrical isolation.

Figure 2:
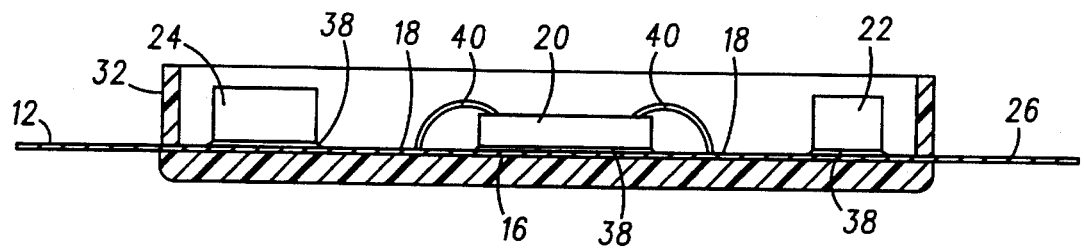
FIG. 2 shows a cross sectional view of an oscillator with attached piezoelectric components on a lead frame, and an annular dam, in accordance with the present.

A second major step comprises an attachment step 104, which provides attaching oscillator components such as a piezoelectric element 24, at least one capacitor 22 and an IC 20, to the lead frame 12, substantially as shown in FIG. 2. These components may be attached by use of a conductive adhesive 38 selectively dispensed onto the top of the lead frame 12 in predetermined positions for the placement of the oscillator components, such as the IC 20, capacitor 22 and piezoelectric element 24. In a preferred embodiment, the conductive adhesive 38 comprises a silver-filled epoxy, such as Amicon C990™ (manufactured by Grace Inc.). However, other suitable conductive epoxies may be used so long as they have the desired properties and characteristics. In a preferred embodiment, the conductive adhesive 38 is automatically dispensed by a Camalot System 5000 (manufactured by Camalot Systems, Inc. of Boston, Mass.) automatic dispensing system, however, a manual method may be used as well.

After the conductive adhesive 38 has been dispensed, the oscillator components, or IC 20, capacitor 22 and piezoelectric element 24 are aligned and placed onto the conductive adhesive 38. As should be understood by those skilled in the art, this process step can be accomplished manually or automatically. In a preferred embodiment, the oscillator components including at least the IC 20, capacitor 22 and piezoelectric element 24, are automatically placed by a Seiko D-Tran XM robotic system (manufactured by Seiko Co. of Japan). After placing the oscillator components, the conductive adhesive 38 is cured. The conductive adhesive 38 may be cured in a convection type, air vented oven (such as one manufactured by Blue-M Corp.) at a temperature of about 150° C. for a predetermined time, such as for about 60 minutes to about 90 minutes until the conductive adhesive 38 is fully cured.

After curing the conductive adhesive 38, the IC 20 is connected to wirebond pads 18. The IC 20 may be connected by wirebonds 40, solder or conductive adhesive. In a preferred embodiment, the IC 20 is connected to the wirebond pads 18 with wirebonds 40. The wirebond 40 is typically gold or aluminum, and the wirebonding process may use either ball or wedge bonding. In a preferred embodiment, the IC 20 is ball bonded with a gold wirebond 40 of from about 0.5 to about 3 mils in diameter (typically a 1 to 1.5 mil diameter is used), for improved wire bonding. A preferred automated wirebonding system is a K&S 1419 wirebonder system (manufactured by Kulicke and Soffa, Inc. of Pennsylvania).

A third major process step involves a dispensing step 106 of dispensing a dam (annular corral) shown as items 30 and 32, in FIG. 1. The dam 34 may comprise various materials, such as silicone, epoxy and the like. In a preferred embodiment, the dam 32 is a non-conductive epoxy, such as Dexter Hysol FP4451™ (manufactured by the Hysol Division of Dexter Corp. of Industry, California) and is syringe dispensed, shown as item 30 through a needle heated to about 35° C. The epoxy dam 32 is dispensed so as to substantially alternately contact the lead frame 12 and the dielectric layer 14 forming an epoxy dam 32 enclosing and sealing each lead 26. In a preferred embodiment, the material for the dam 32 is selected to have a property whereby the material sticks to where it is applied. The advantages of dispensing a non-conductive epoxy dam 32 are many. First, the use of a dispensed epoxy dam eliminates an extra epoxy processing step that would be needed to mount a preformed or machined dam. Second, dispensing shown as item 30, can be less costly than the use of a preformed or machined dam. Third, chances of shorting the leads 26 when dispensing a non-conductive epoxy dam 32 are substantially nonexistent. Fourth, the use of a non-conductive epoxy dam 32 substantially reduces the possibility of parasitic capacitances with the leads 26 causing signaling problems.

Figure 3:
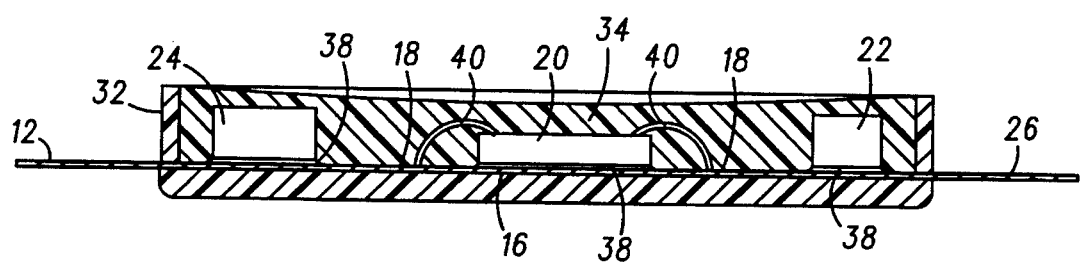
FIG. 3 shows a cross sectional view of the oscillator, with an encapsulant in the dam, in accordance with the present invention.

A fourth major process step includes a filling step 108. As shown in FIGS. 1 and 3, this step 108 provides dispensing an encapsulant 34 and 36 in a dam 32. This step can begin with preheating the lead frame 12 to a temperature of from about 65° to about 85° C. The encapsulant 34 may be of a material such as silicone or epoxy. In a preferred embodiment, the encapsulant 34 is a material such as Dexter Hysol FP4450™ (manufactured by the Hysol Division of Dexter Corp. of Industry, California) and is syringe dispensed 36 through a needle heated to about 35° C. The encapsulant 34 is of a lower viscosity than the material used for the dam 32, and is dispensed, as item 36, into an interior cavity (reservoir) defined by the dam 32 on the outside and the dielectric layer 14, or alternatively a transporter 28, on the bottom.

In one embodiment, the encapsulant 34 is dispensed 36 in a spiral pattern over the oscillator components (IC 20, a capacitor 22 and a piezoelectric element 24), to provide a substantially uniform coating and to improve flow to avoid trapped voids or air bubbles. In a preferred embodiment, the encapsulant 34 material is chosen to have a viscosity adapted to substantially fill the interior cavity by gravity, whereby minimal voids or air bubbles are formed. The encapsulant 34 should be dispensed to substantially completely and uniformly fill the cavity formed by the dam 32, up to about a top of the dam 32. It is preferred that the encapsulant 34 not exceed a top of dam 32. Also, it is preferred that the top surface of the encapsulant 34 be substantially flat so as to facilitate automatic marking, labeling, and handling by automated pick and place equipment.

The dispensing of the encapsulant 34 shown as item 36, has an advantage over transfer molding techniques in that the process is of a lower temperature and pressure than most known transfer molding techniques. In addition, there is substantially no flashing problem as may be experienced with transfer molding techniques.

A fifth major process step is a curing step 110. This involves curing the dam 32 and encapsulant 34. In a preferred embodiment, the dam 32 and encapsulant 34 are simultaneously cured in any suitable manner, such as in a convection type, air vented oven (such as one manufactured by Blue-M Corp.) at a temperature of about 125° C. for a period of about 30 minutes followed by a temperature of about 165° C. for a period of about 60 minutes until the dam 32 and encapsulant 34 are substantially fully cured.

The advantage of this step 110, is that the encapsulant 34 and the epoxy dam 32 can be cured at the same time in a single step. In addition, in one embodiment, since the encapsulant 34 and the epoxy dam 32 are both made from similar epoxies, they will have very similar thermal expansion coefficients. This is in contrast to the prior art condition where a metal dam is present, having an order of magnitude difference in thermal expansion coefficient over an encapsulant. After the dam 32 and encapsulant 34 have been cured, the leads 26 and lead frame 12 may be electroplated with lead/tin to prevent corrosion and improve the solderability of the leads 26.

The final major process step is a singulating step 112. This step provides singulation (or separation) of the crystal oscillator 10 from the remaining unwanted portion of the lead frame 12. The crystal oscillator is excised from the lead frame by shearing the leads 26 near the inside periphery of the lead frame 12. A preferred device used for this singulation step 112, can be a punch tool such as one manufactured by a tool and die maker, such as Dial Tool & Mfg. Corp. of Illinois. In a preferred embodiment, the singulation step 112 is performed automatically. After singulation, the crystal oscillator 10 may be electrically tested.

Figure 4:
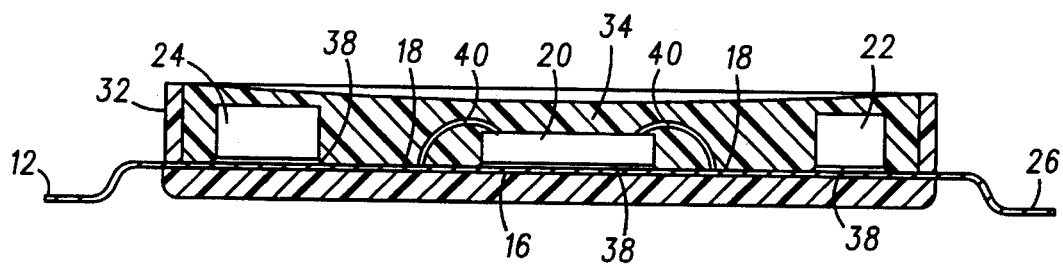
FIG. 4 shows a cross sectional view of the oscillator with the dam and encapsulant cured, and after being excised from the lead frame and having the leads formed for mounting (gullwing version shown), in accordance with the present invention.

In a preferred embodiment, as shown in FIG. 4, the leads 26 are bent during or after the automatic excision of the crystal oscillator 10 from the lead frame 12 to make the crystal oscillator 10 surface mountable. The leads 26 may be formed into various shapes per surface mounting requirements. FIG. 4 shows an embodiment in the form of a gullwing lead shape. However, other lead shapes, such as butt-joint leads or J-shaped leads may be made.

Although various embodiments of this invention have been shown and described, it should be understood that various modifications and substitutions, as well as rearrangements and combinations of the preceding embodiments, can be made by those skilled in the art, without departing from novel spirit and scope of this invention.

What is claimed is:

1. A method of making a surface mountable-lead frame crystal oscillator, comprising:

assembling a lead frame with a dielectric layer, the lead frame includes a plurality of cells having top and bottom surfaces;

attaching oscillator components to the top of the lead frame;

dispensing a predetermined first viscous material to form a dam substantially around a periphery of each cell;

substantially filling the dam with a second viscous material;

curing the first and second viscous materials; and singulating each cell to form a surface-mountable lead frame crystal oscillator.

2. The method of claim 1, further comprising the step of:

bending and adjusting each lead of the lead frame suitable for surface mounting.

3. The method of claim 2, wherein the bending step includes forming a plurality of at least one of gullwing leads, butt-joint leads and J-shaped leads.

4. The method of claim 1, wherein the assembling step includes:

aligning and contacting a polyimide layer having an adhesive on the top surface with the bottom surface of the lead frame, to attach the polyimide layer with the lead frame.

5. The method of claim 1, wherein before the first step, further comprising the step of plating a substantially middle portion of each cell with a precious metal such that an integrated circuit is wire bondable to the lead frame.

6. The method of claim 1, wherein the attaching step includes:

selectively dispensing a conductive adhesive on the lead frame;

placing and aligning a piezoelectric element, at least one capacitor, and an IC on the conductive adhesive;

curing the adhesive; and wire bonding the IC to the lead frame.

7. The method of claim 1, wherein the dispensing step includes the dam alternately contacting the lead frame and the dielectric layer around the periphery of each cell.

8. The method of claim 1, wherein the dispensing step includes selecting the first viscous material having a higher viscosity than the second viscous material.

9. The method of claim 8, wherein the dispensing step includes selecting the first viscous material to have a predetermined viscosity which will substantially stick to where it is applied.

10. The method of claim 1, wherein the filling step includes selecting a second viscous material having a predetermined viscosity adapted to substantially fill a receptacle by gravity, whereupon during curing, minimal if any, voids are formed.

11. The method of claim 1, further comprising selecting the first and second viscous materials which include at least one member of the group consisting of silicone and epoxy.

12. The method of claim 1, wherein the assembling step includes forming a dielectric layer by screen printing a viscous material on a bottom surface of the lead frame to form a substantially continuous layer upon cure.

\* \* \* \* \*